(12) United States Patent
Nakanishi et al.

(10) Patent No.: US 6,318,908 B1
(45) Date of Patent: Nov. 20, 2001

(54) LIGHT TRANSMITTING/RECEIVING MODULE

(75) Inventors: Hiromi Nakanishi; Yoshiki Kuhara, both of Osaka (JP)

(73) Assignees: Sumitomo Electric Industries, Ltd., Osaka; NHK Spring Co., Ltd., Yokohama, both of (JP)

( * ) Notice: Subject to any disclaimer, the term of this patent is extended or adjusted under 35 U.S.C. 154(b) by 0 days.

(21) Appl. No.: 09/497,866

(22) Filed: Feb. 4, 2000

(30) Foreign Application Priority Data

Feb. 9, 1999 (JP) ................................................. 11-030855

(51) Int. Cl.[7] ...................................................... G02B 6/36
(52) U.S. Cl. ................................................. 385/89; 385/92
(58) Field of Search ............................................ 385/88–94

(56) References Cited

U.S. PATENT DOCUMENTS 5,764,826 * 6/1998 Kuhara et al. .

6,128,428 * 10/2000 Yomeda .

FOREIGN PATENT DOCUMENTS 11 237 529    8/1999  (JP) .

* cited by examiner

Primary Examiner—Hung N. Ngo
(74) Attorney, Agent, or Firm—Smith, Gambrell & Russell LLP

(57) ABSTRACT

Simultaneous bidirectional transmission type LD/PD module having a substrate, a signal transmitting part mounted on the substrate, a signal receiving part formed on the substrate, an end of a fiber communicating with a base station, a light waveguide coupling the fiber to the transmitting part and the receiving part, a filter separating the receiving signal light from the transmitting signal light and a resin mold package containing the substrate, the transmitting part, the receiving part, the filter and the lead frame. The receiving part is electromagnetically shielded with multihole metal members from the noise generated by the transmitting part. The resin penetrates through the holes and fully covers the receiving part.

32 Claims, 14 Drawing Sheets

LIGHT TRANSMITTING/RECEIVING MODULE

BACKGROUND OF THE INVENTION

1. Field of the Invention

This invention relates to a light transmitting/receiving module, eg., to PD/LD(or LED) module having a light signal receiving part and a light signal transmitting part. This invention, in particular, proposes an improvement of an inexpensive resin-molded package for a PD/LD module for simultaneous bidirectional optical communication by light signals of different wavelengths. This invention aims at the protection of the PD port against the noise generated by the LD port in the simultaneous, bidirectional PD/LD module.

2. Description of Related Art

This application claims the priority of Japanese Patent Application No. 11-30855 (30855/1999) filed on Feb. 9, 1999 which is incorporated herein by reference.

A prior PD/LD module has an independent laser diode (LD) module (e.g., shown in FIG. 1) and an independent photodiode (PD) module (e.g., shown in FIG. 2). The PD module is sealed in a metal package. The LD module is also sealed in another metal package. The PD module and the LD module are independently shielded from noise by their own metal-can package.

A prior typical LD module is explained by referring to FIG. 1. The LD module 1 has a round metal stem 2. A pole 3 stands on the stem 2. An LD chip 4 is mounted on a submount fixed on the side wall of the pole 3. A PD chip 5 is fitted at the center of the stem 2 just beneath the LD chip 4. The stem 2 holds a metallic cylindrical lens holder 6 welded on the upper surface. The lens holder 6 sustains a lens 7 at a top opening. A conical ferrule holder 8 is welded upon the lens holder 6. A ferrule 10 holds an end of an optical fiber 9. The ferrule holder 8 supports the ferrule 10 at a top opening. A cap 14 having a top hole covers the central part of the stem 2.

Edges of the ferrule 10 and the fiber 9 are slantingly ground for preventing the reflecting light from going back to the LD 4. The LD 4 yields transmitting light signals. The rear PD 5 is equipped for monitoring the output light power of the LD 4. The transmitting signals are converted from electric signals to light signals by modulating the driving current of the LD 4. The driving current of the LD 4 and the photocurrent of the PD 5 are supplied from or replenished to external electric circuits through lead pins 11, 12 and 13 on the stem 2. The stem 2, the lens holder 6 and the ferrule holder 8 are made from metals. These members form a metal package of the LD module. Since the package is made from metals, the package shields and protects the LD module from external electromagnetic noise. The transmitting part generates large electromagnetic waves (inner noise) due to the big driving current flowing in the LD. The inner noise is shielded by the LD metal package. The PD module was doubly protected from the noise by the metal-can package.

A prior PD module is explained by referring to FIG. 2. The PD module 15 has a circular metallic stem 16 including a central protuberance. A PD chip 17 is mounted upon the protuberance. A metal cap 18 with a top opening is welded upon the stem 16 for protecting the PD chip 17 and other members. A metallic cylindrical lens holder 19 is welded upon the stem 16. The lens holder 19 maintains a lens 26 at a top opening. A conical ferrule holder 20 is welded upon the lens holder 19. A tubular ferrule 22 keeps an end of an optical fiber 21. The ferrule 22 is inserted and fixed in a top hole of the ferrule holder 20. Ends of the fiber 21 and the ferrule 22 are ground slantingly for inhibiting the end surface from reflecting the light back to the laser. The PD module 15 is protected in a metallic case comprising the metal stem 16, the metal lens holder 19 and the metal ferrule holder 20. The receiving part has a high impedance which is subject to external noise. The metallic case connected to the ground level shields the PD module from the external noise.

A driving circuit accompanies the LD module for supplying the driving current modulated by the transmitting signals. The driving circuit contains a modulating circuit, a power amplifier or so. The driving circuit is enclosed by a metal package which forbids noise to go out of the driving circuit. Thus, the prior driving circuit does not emit noise. An amplification circuit follows the PD module for amplifying the photocurrent. The amplification circuit is also resistant against external noise since it is protected by a metallic case.

The prior PD/LD module has an independent PD module, a free amplification circuit, an isolated LD module and a separated driving circuit. Each of the parts is stored in an independent metallic package. The metallic packages kill mutual interference between the LD and the PD. Simultaneous signal reception and signal transmission does not induce a problem that the strong transmitting signals from the LD would mix with the weak received signals on the PD in the prior PD/LD module. The simultaneous transmission and reception is an important precondition of the present invention. The LD generates strong electromagnetic waves since the LD is applied by strong, rapid-changing modulating current. The reception port is subject to noise due to the weak photocurrent and the high amplification rate. The simultaneous transmission and reception has a tendency of bringing the transmission signals to the reception port as noise. If the transmitting part and the receiving part are stored in two different metal cases, the packages doubly shield and protect the PD port from the noise of the LD.

The noise (crosstalk) transference from the LD to the PD is an important criterion of the PD/LD module which makes use of a single fiber for transmitting and receiving signals, as shown in FIG. 3. FIG. 3 shows a bidirectional system between the central base station and the subscriber (ONU: optical network unit). Although there are a plenty of subscribers for a single station, FIG. 3 shows only a single subscriber (ONU). The base station is equipped with an LD1 for transmitting optical signals to the ONU and a PD1 for receiving signals from the ONU. The LD1 and the PD1 are connected by fibers 27 and 33 to a WDM (wavelength division multiplexer) 28. The WDM 28 joins with an optical fiber 29. The ONU has an LD2 for transmitting signals to the station and a PD2 for receiving signals from the station. The PD2 and the LD2 are connected by fibers 31 and 32 to another WDM 30. The ONU side WDM 30 communicates with the station side WDM 28 by the fiber 29. In FIG. 3, the signals propagating from the station to the subscriber are called "down-flow". The signals spreading from the ONU to the station are called "up-flow". The single fiber 29 allows simultaneous bidirectional transmission of information between the ONU and the station.

The transmission/reception system has a simultaneous communication type and an alternate communication type concerning the timing of signal transmission, and has a single fiber type and a double fiber type with regard to the number of fibers. The alternate type is also called a ping-pong communication. There are thus four types of communication systems. The system of FIG. 3 can be applied also to the alternate type. The alternate (ping-pong) type allocates different timing for the transmission and the reception on the subscriber site (ONU). The alternate type allows both the single-fiber medium and the double-fiber medium. The ping-pong type system can make use of the same wavelength of light for both the up-flow and the down-flow transmissions. In the case of using the same wavelength, the light division devices 28 and 30 are beam-splitters. The ping-pong type is free from the crosstalk or the internal noise between the transmitting signals and the receiving signals, since the timing of the reception is different from the timing of the transmission on the subscriber site. There is no need for shielding the receiving part from the transmitting part in the ping-pong type. Thus, the ping-pong type is excluded from the scope of the present invention.

The simultaneous type is the subject of the present invention. FIG. 3 can be also applied to the simultaneous communication. Since the system relies only upon the single fiber, different wavelengths ($\lambda 1$ and $\lambda 2$) should be allocated to the down-flow ($\lambda 2$) signals and the up-flow ($\lambda 1$) signals. In the multiwavelength communication, the light division devices 28 and 30 mean WDMs (wavelength division multiplexers) which have wavelength selectivity.

FIG. 4 shows the structure of a prior ONU (subscriber site) module. The module has an LD module 1 and a PD module 15 which are contained in separate independent packages. For example, the up-flow signals take 1.3 $\mu$m light ($\lambda 1$) and the down-flow signals adopt 1.55 $\mu$m light ($\lambda 2$). A single optical fiber 34 carries the down-flow and the up-flow signals between the base station and the subscriber site. What integrates and divides the down-flow and the up-flow signals by the difference of the wavelengths is a WDM. FIG. 4 denotes an optical waveguide type WDM 37. Two waveguide paths exchange their energy at a joining part 38 fabricated on the waveguide layer. In the example, the 1.3 $\mu$m light goes straight but the 1.55 $\mu$m light bends at the joining part 38. The 1.3 $\mu$m up-flow signals emanating from the LD module 1 pass a fiber 9, an optical connector 41, a fiber 36, the WDM 37, an optical connector 35 and the fiber 34 to the base station.

The 1.55 $\mu$m down-flow signals propagate in the fiber 34, the optical connector 35, the WDM 37, a fiber 39, an optical connector 40 and a fiber 21 and enter the PD module 15. In this case, the single fiber 34 can be replaced by two fibers. Despite the number of the fibers, there is a probability of the transmitting part having an influence upon the receiving part through electromagnetic waves. The problem of the crosstalk or the inner noise is surely denied by building the LD module sealed by a metal package as shown in FIG. 1, the PD module sealed by an independent metal case as shown in FIG. 2. The expensive LD/PD module of FIG. 4 is immune from the noise, since the independent metal case shields the PD chip electromagnetically and the metal LD case suppresses the electromagnetic waves from the LD chip.

The ONU device of FIG. 4 employing the metal-shielded LD module of FIG. 1 and the metal-case PD module of FIG. 2 is free from the problem of the inner noise of the LD (transmitting part) invading and disturbing the PD circuit (receiving part). The LD/PD (ONU) module of FIG. 4, however, is too expensive owing to many costly parts and devices. Furthermore, there is another defect that the direction of the fiber is perpendicular to the plane of the stem (package). This is a geometric defect which induces a difficulty for reducing the size of the module. Since signal light propagates for a long distance in space, the LD and the PD require lenses for converging the light. The PD module and the LD module are bulky and large by themselves. Then the PD/LD module integrating the PD module of FIG. 2 and the LD module of FIG. 1 should be a large device. The expensive metal packages for the PD, the LD, the LD driving circuit and the preamplifier raise the parts cost of the ONU module of FIG. 4. As long as the ONU module persists in the expensive large-sized LD/PD module, the bidirectional communication would not prevail in the general public. Inexpensiveness and small-size of the ONU modules are the requisite for prevalence of the optical bidirectional communication. Miniaturization of the ONU (LD/PD) module dislikes separate PD and LD which would raise the cost and the size.

Some trials for reducing the cost and the size of the ONU module have been done by unifying a PD and an LD (and an amplifier) on a common substrate. The new contrivance tries to simplify the module by mounting an LD and a PD on a single substrate and guiding light in parallel to the substrate. The mode of mounting is called planar lightwave circuit (PLC) mounting since the LD, the PD and the waveguides are positioned at the same height on the substrate. The planar module has horizontal propagating directions of the PD light and LD light different from FIG. 1 and FIG. 2. Besides the PD and the LD, an amplifier AMP is often mounted on the same substrate. In the case, the resistance against noise is raised by the amplifier stored in the same package.

The common substrate containing the LD, the PD and the AMP diminishes the size of the module and reduces the weight. The chips of PD, LD and AMP are small enough. The module containing the chips is also small. The number of the packages is reduced. The reduction of the packages decreases the cost of the module. Adoption of a ceramic package would lead to an expensive module despite the reduction of the number of the packages. A resin mold type gives the most popular and most inexpensive packages. This invention aims also at sealing the module with a resin mold type package.

Even the planar type module is free from the problem of noise when the LD driving current is weak enough (namely the short-range communication). The large driving current required by the long-range communication induces a difficult problem of the crosstalk (or inner noise) from the LD to the PD. Strong LD electric signals propagate in space and induce noise in the receiving part. High repetition rate and strong power of the LD signals yield strong electromagnetic waves. The receiving part of the PD and the AMP has a high input impedance and high amplification ratio which have a tendency of inviting noise. Namely, the LD/PD module has a structure which allows the receiving (PD) part to couple with the transmitting (LD) part electromagnetically. The noise transmission from the LD to the PD is also called "crosstalk". The noise lowers the sensitivity of the receiving part. The shorter distance between the LD and the PD/AMP brings about the more serious difficulty. Namely, the problem of the crosstalk would become more severe, when the size of the module is reduced.

SUMMARY OF THE INVENTION

The purpose of the present invention is to provide a bidirectional optical PD/LD module which can protect the receiving part from the noise induced by the transmitting part (LD).

The LD/PD module of the present invention includes a transmitting part, a receiving part, an end of a fiber, a waveguide for connecting the end of the fiber to the receiving part and the transmitting part, a metal mesh or a multihole metal plate for covering the receiving part, a resin mold package for enclosing the transmitting part, the receiving part and the metal mesh or the multihole metal plate.

This invention shields the receiving part from the influence of the transmitting part by covering the receiving part with the metal mesh or multihole metal plate. The metal mesh or the multihole metal plate excludes the strong electromagnetic waves emitted from the transmitting part. The reason why the multihole metal plate or the metal mesh should be used is that the resin can invade into the metal plate or the mesh and can densely cover the receiving part. If the receiving part were covered with a holeless metal cap, the resin could not go into the inner space for protecting and fixing the receiving part. To avoid such a defect, this invention covers the transmitting part with the mesh or the multihole plate. Fluid resin flows through the holes within the metal plate or the mesh, occupies the inner space and is hardened there. The request of protecting the receiving part with the resin forces this invention to employ the metal with holes. A larger number of holes and bigger holes would facilitate the resin to infiltrate into the receiving part. But too many and too large holes would reduce the function of shielding the receiving part from the electromagnetic noise. The number or the size of the holes should be determined by taking account of the viscosity of the fluid resin and the intensity of noise. If a ceramic package would be employed, the receiving part should be protected with a holeless metal plate. But this invention does not choose the ceramic package due to the expensiveness. This invention employs a plastic mold type package for reducing the cost.

The ONU module can be miniaturized by unifying the transmitting part and the receiving part. The unified module is far smaller than the separated module shown in FIG. 1, FIG. 2 and FIG. 4. If the unified module were to be stored in a ceramic package, the module would be still expensive. This invention prefers a cheap plastic package to the superb ceramic package for cutting down the cost. The integration of the LD and PD on the same substrate, the resin mold package, and the metal shield on the PD part enable the present invention to provide a small-sized, inexpensive, highly-reliable LD/PD module.

The advantages are explained here. Mounting of the PD part and the LD part on the same substrate enables this invention to miniaturize the LD/PD module. The present module is far smaller, still lighter than the prior module consisting of independent devices as shown in FIG. 1, FIG. 2 and FIG. 4. Instead of an expensive metal package or a ceramic package, this invention packages the module with cheap resin molding, which cuts the cost down. Low-cost of the LD/PD module is a requisite for popularizing the optical communication. The multihole metal member enables the module to suppress the crosstalk by shielding and protecting the PD part from the noise generated by the LD part. The suppression of the noise enhances the sensitivity through lowering the noise level. High sensitivity is also an advantage. The planar disposition of devices on a single substrate facilitates manufacturing. The planar structure and the crosstalk suppression enable this invention to produce low-cost, small-sized, high-sensitivity LD/PD modules on a large scale.

DETAILED DESCRIPTION OF THE EMBODIMENTS

[Embodiment 1 (Y-branch Waveguide)]

Figure 1:
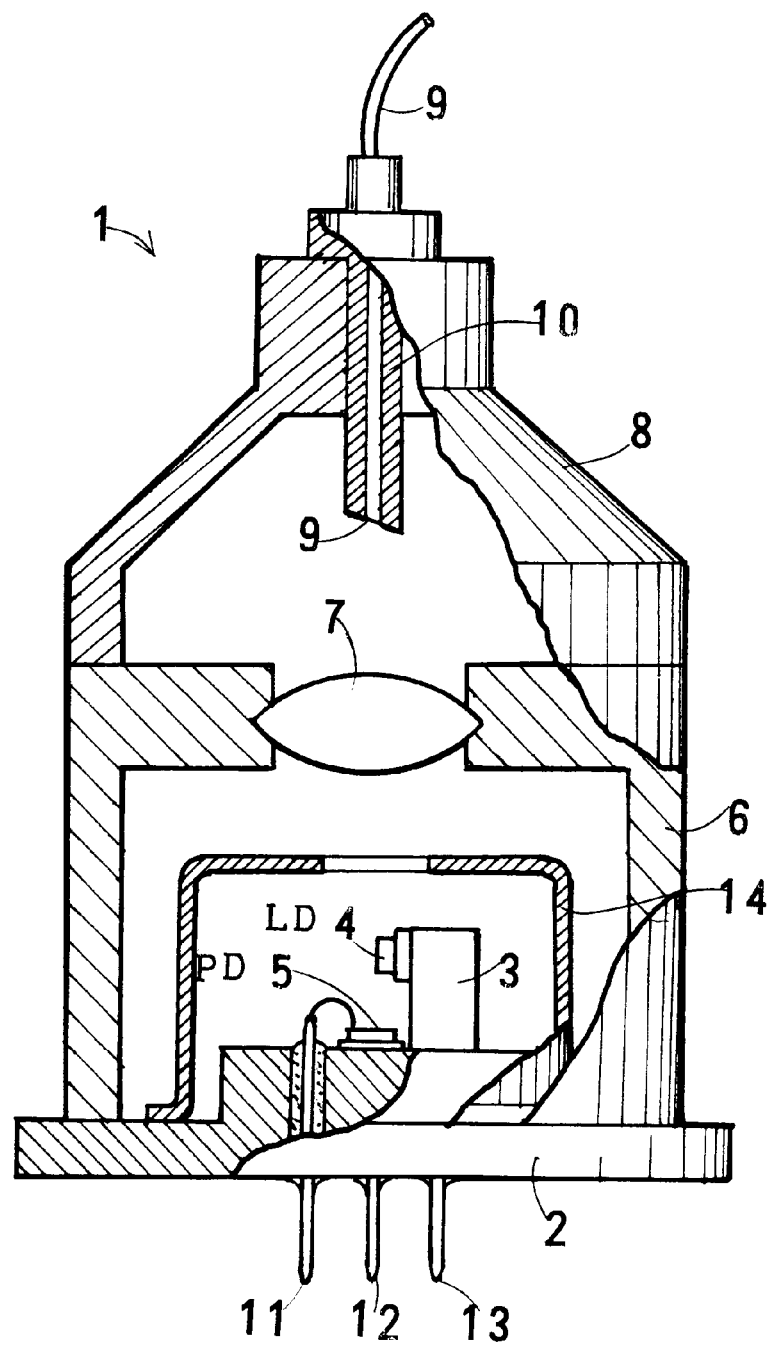
FIG. 1 is a sectional view of a prior LD module contained in a metal package.
Figure 2:
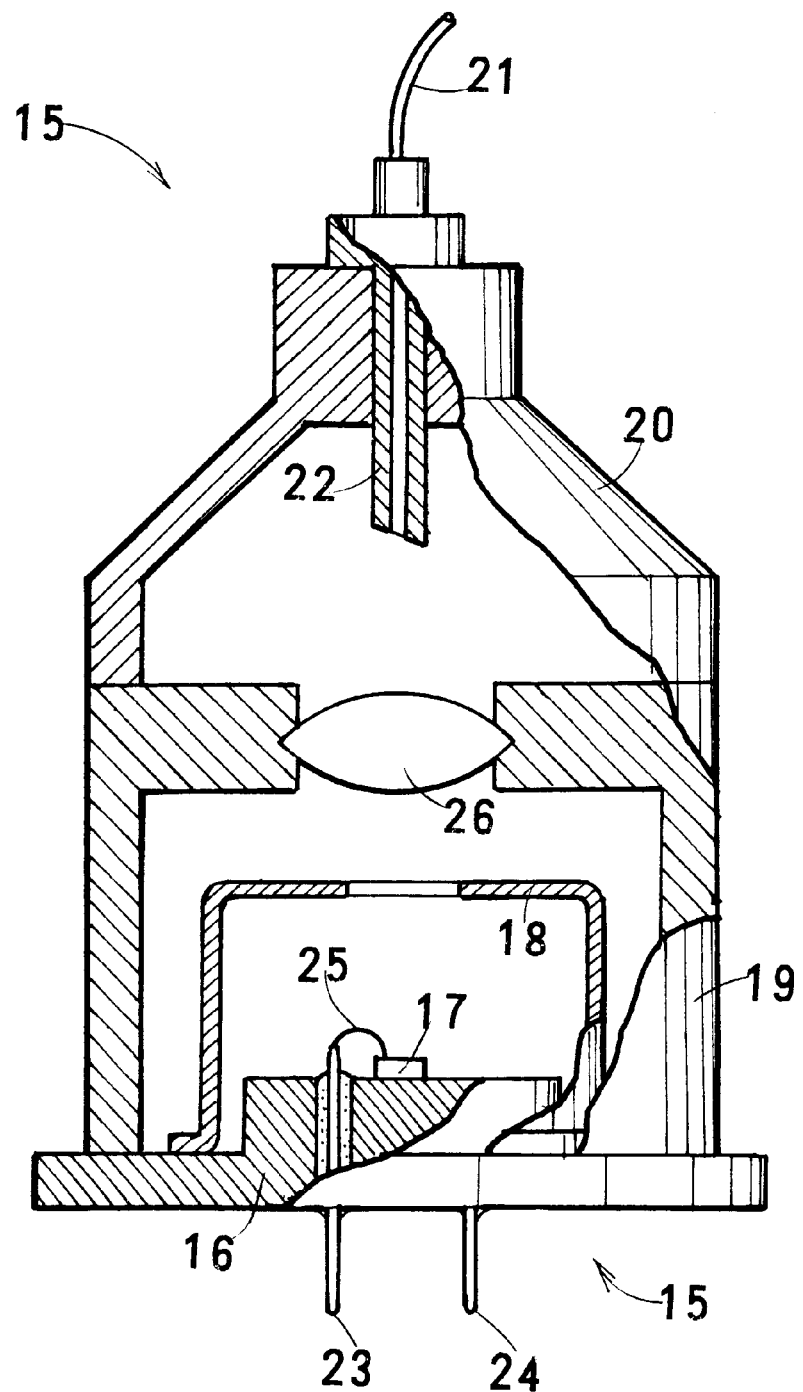
FIG. 2 is a sectional view of a prior PD module contained in a metal package.
Figure 3:
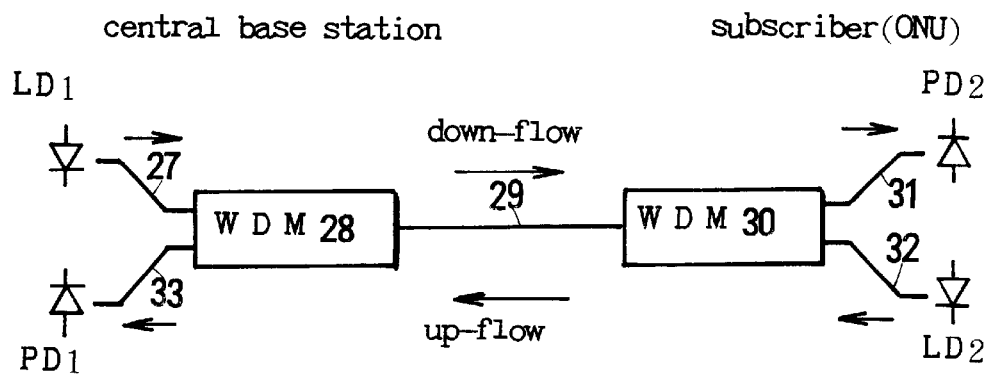
FIG. 3 is a schematic view of a bidirectional optical communication system.
Figure 4:
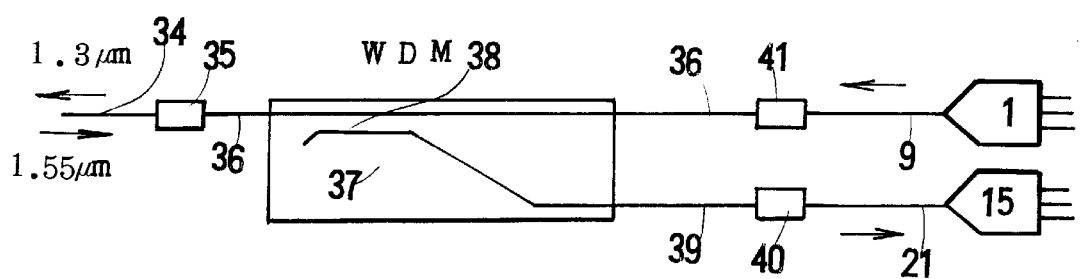
FIG. 4 is a schematic view of a prior LD/PD module at a subscriber site.
Figure 5:
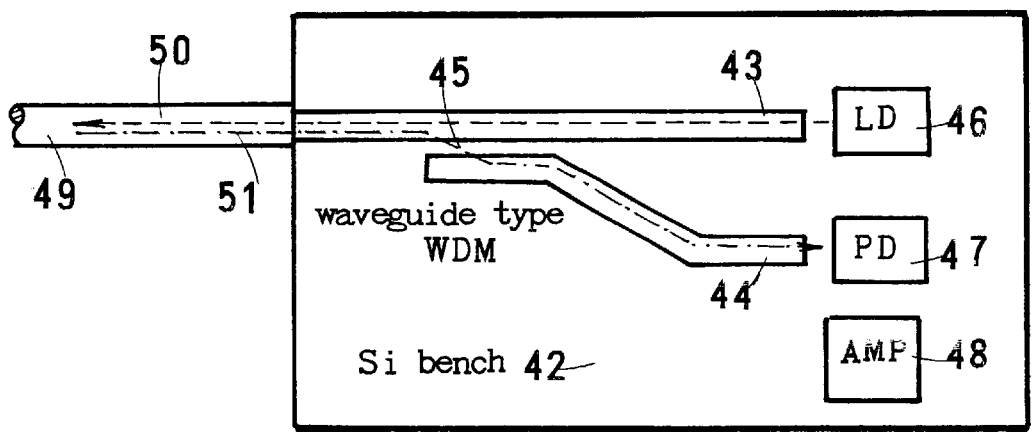
FIG. 5 is a plan view of an LD/PD module unifying a receiving part and a transmitting part on a single Si bench.

FIG. 5 to FIG. 11 demonstrate embodiment 1 having a silicon bench (platform) with a Y-branch waveguide. FIG. 5 shows a design of locations of parts on the silicon bench 42. The silicon bench 42 is prepared by making a transparent silicon dioxide ($SiO_2$) layer upon a silicon crystal substrate by a sputtering method or an oxidization method. Doping the $SiO_2$ layer with a dopant for raising the refractive index makes a straight waveguide 43 and a bent waveguide 44 on the Si bench 42. The adjacent parts of the waveguides form a WDM (wavelength division multiplexer: waveguide type optical coupler) 45. Aiming at the simultaneous transmission, this invention employs two different wavelengths $\lambda 1$ and $\lambda 2$. The WDM 45 has the wavelength selectivity of selecting either $\lambda 1$ or $\lambda 2$ for propagating in the waveguide 43 or 44. Metallized patterns (not shown in the figures), for example, an LD ground pattern, a PD/AMP ground pattern or other wiring patterns, are printed on the silicon bench 42. In the example, the LD ground is separated from the PD/AMP ground. These grounds are joined by an external circuit. Facing the right end of the direct waveguide 43, an LD chip 46 lies on the bench 42 via the ground metallized pattern. A PD chip 47 is mounted upon the PD/AMP ground pattern at the right end of the bent waveguide 44. The AMP (preamplifier) lies on the same ground pattern in the vicinity of the PD 47. The left end of the waveguide 43 couples to an end of an optical fiber 49.

A transmitting signal (output) light 50 emanating from the LD 46 propagates in the waveguide 43, the WDM 45 and the fiber 49. Propagating in the fiber 49, receiving signal (input) light 51 goes into the waveguide 43, traverses the WDM 45, runs in the waveguide 44 and arrives at the PD 47. Actually, the silicon bench 42 is fitted on a lead frame for joining the patterns to leads with wires. The lead frame and the wires are omitted for simplicity in FIG. 5 to FIG. 7. The planar waveguides and the WDM divide the signal light by the wavelength for allotting the 1.55 $\mu$m light to the PD 47 and the 1.3 $\mu$m light to the LD 46. Integrating and mounting three devices on a single substrate enables this invention to miniaturize the LD/PD module. The direction of the light propagation is in parallel to the surface of the bench. The parallel light propagation facilitates the miniaturization further.

Figure 6:
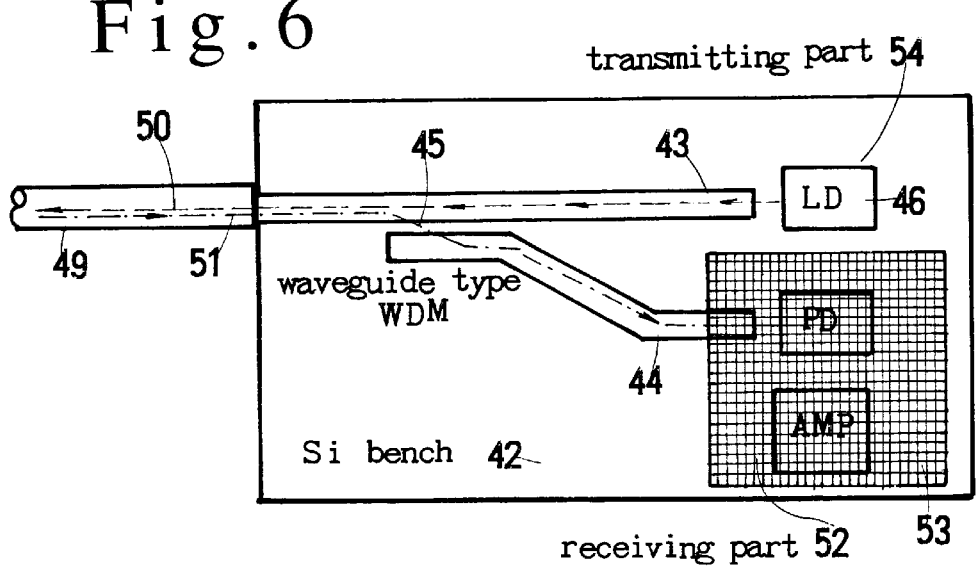
FIG. 6 is a plan view of an LD/PD module unifying a receiving part and a transmitting part on a single Si bench and covering the receiving part with a metal mesh.
Figure 7:
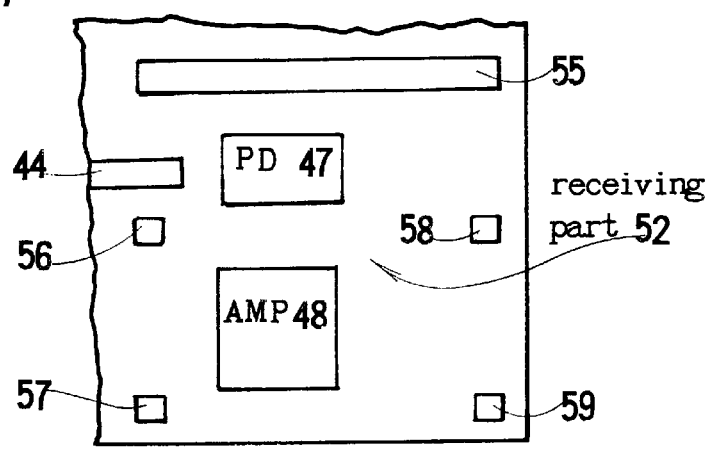
FIG. 7 is a plan view of the receiving part with pillows in the LD/PD module of FIG. 5.
Figure 8:
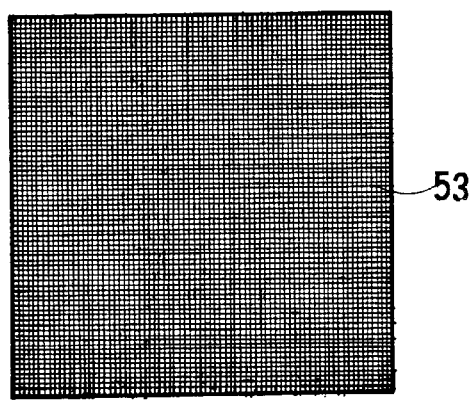
FIG. 8 is a plan view of a metal mesh for covering the receiving part.

A receiving part 52 comprises the PD 47 and the AMP 48 in FIG. 6. The LD 46 is a transmitting part 54 in the example. FIG. 7 shows the receiving part 52 having pillows 55, 56, 57, 58 and 59 adhering to ground patterns and enclosing the PD and the AMP. The pillows are made from Kovar, stainless steel or another metal. A metal mesh 53 shown in FIG. 8 is glued upon the pillows 55, 56, 57, 58 and 59. As denoted in FIG. 6, the PD and the AMP are covered with the metal mesh 53. Both the PD 47 and the AMP 48 are bonded on the ground patterns. The pillows and the mesh are metallic members being grounded. Thus, the PD 47 and the AMP 48 are fully protected by the grounded metals. A grounded metal case shields electromagnetic waves. The grounded metals prevent noise from invading to the receiving part. The PD 47 and the AMP 48 are protected from the noise emitted by the transmitting part (LD).

Figure 9:
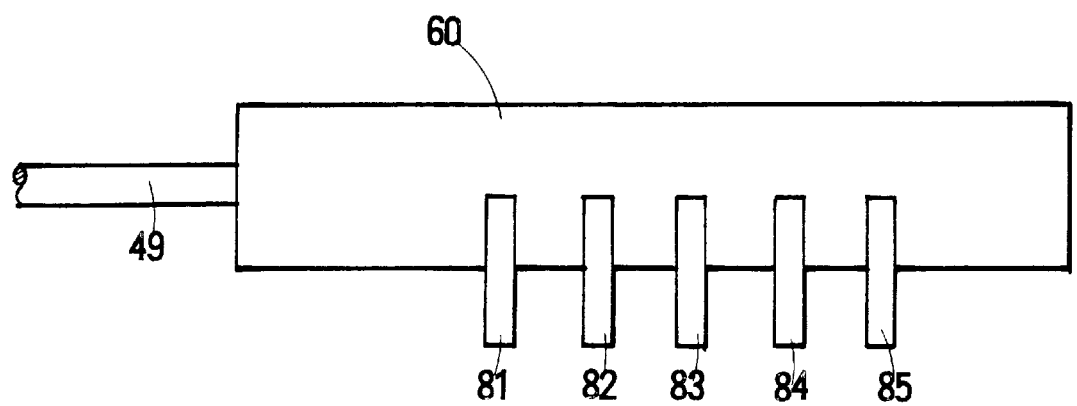
FIG. 9 is a front view of the LD/PD module of FIG. 6 which has been mounted upon a lead frame and been molded with a resin.
Figure 10:
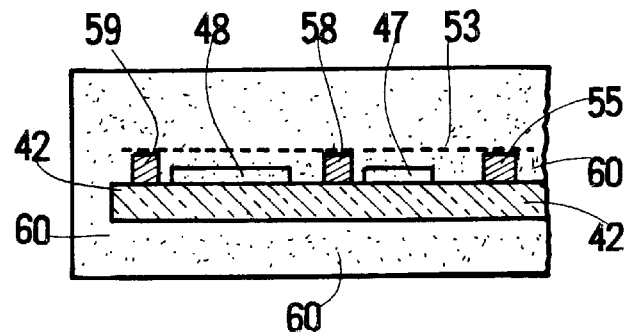
FIG. 10 is a sectional right side view of the receiving part in the LD/PD module of FIG. 9.
Figure 11:
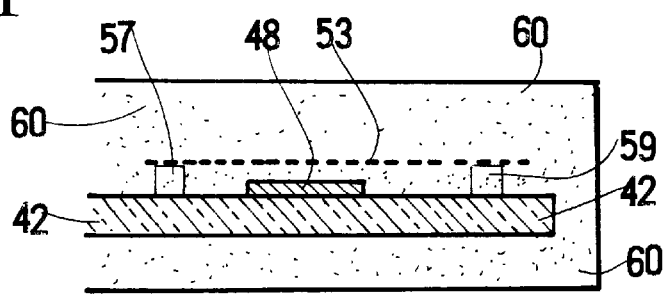
FIG. 11 is a sectional front view of the receiving part in the LD/PD module of FIG. 9.

The reason why the shield metal is a mesh is that the shield metal should allow fluid resin to infiltrate into the receiving part for protecting the PD chip and the AMP chip. In FIG. 6, metallized patterns, a lead frame or wires are omitted. Actually, the metallized patterns, the lead frame are connected by the wires. The Si-bench 42 is resin-packaged into a complete device by loading the Si-bench into a mold, supplying a fluid resin 60 into the mold and hardening the resin by heating or cooling. This operation is called "molding". The resin itself is often called "mold". FIG. 10 and FIG. 11 are sections of the receiving part of the molded sample. In the figures, the mesh 53 rides on the pillows 55 to 59 stuck to the silicon bench 42. The resin in the fluid state infiltrates the small holes of the mesh 53 into the inner space of the receiving part 52 and fills all the space without void. The role of the resin 60 is to be a package which encloses the PD, the AMP, the LD, the patterns and the Si bench for inhibiting water or gas from invading into the inner space. FIG. 9 is a front view of the complete LD/PD module of the invention. This example has the package of the dual-in-line (DIP) type which has two arrays of pins (81,82,83,84,85, . . . ) on both sides. The order of the pins is arbitrary. An end of the fiber 49 is buried in the plastic mold. The metal mesh is hidden in the resin 60. The device is similar to an ordinary IC except the extending fiber. The standardized shape facilitates the handling of the module.

The function of the module is explained. The module simultaneously sends signals to the station and receives signals from the station. High-repetition rate pulse current flows in the LD 46. The rectangular (square) pulse current includes high frequency components. The LD current is big enough. The large current with high frequency generates strong electromagnetic waves at the LD. The receiving part 52 of the PD and the AMP has a high input impedance which is subject to electromagnetic waves. The PD and the AMP are, however, enclosed and protected by the metallic ground pattern, the metallic pillows and the metal mesh from the noise exhaled from the LD. The use of the multihole plate or the mesh enables the fluid resin to fill the inner space without void. The metallic shield and the resin mold give a small-sized, inexpensive, high-performance LD/PD module.

Figure 12:
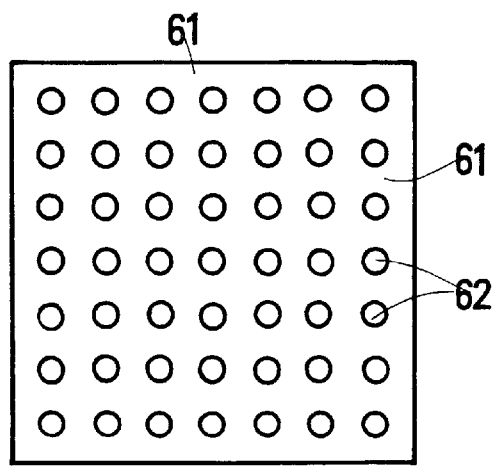
FIG. 12 is a plan view of a multihole metal plate for covering the receiving part instead of the metal mesh of FIG. 8.

The above example has employed the metal mesh 53. The mesh can be easily replaced by a metallic multihole plate 61 as shown in FIG. 12. This is a square flat plate 61 with a plenty of small holes perforated crosswise and lengthwise. The multihole plate 61 has a similar function of suppressing the invasion of the noise from the LD and of guiding the resin into the inner space.

[Embodiment 2 (Straight Waveguide, Upward Branch, Multihole+Pillows)]

Figure 13:
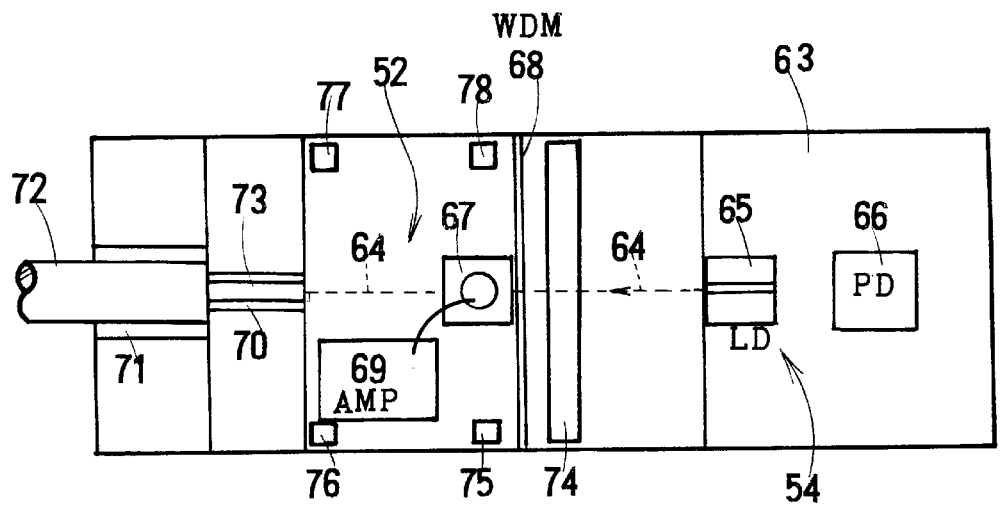
FIG. 13 is a plan view of a silicon platform (bench) having a straight light waveguide, a PD, an AMP, a WDM filler, an LD, a monitoring PD and pillows.
Figure 14:
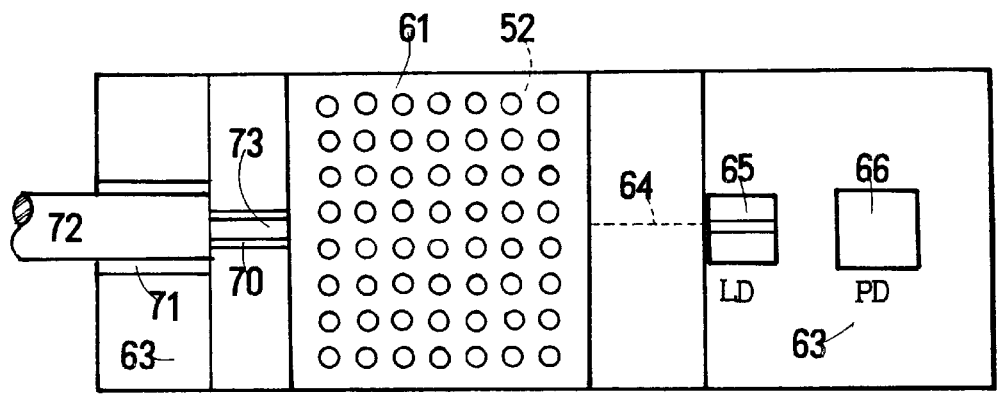
FIG. 14 is a plan view of the silicon platform having the straight light waveguide, the PD, the AMP, the WDM filter, the LD, the monitoring PD, the pillows and a multihole metal plate fixed to the pillows for covering the PD and the AMP.
Figure 15:
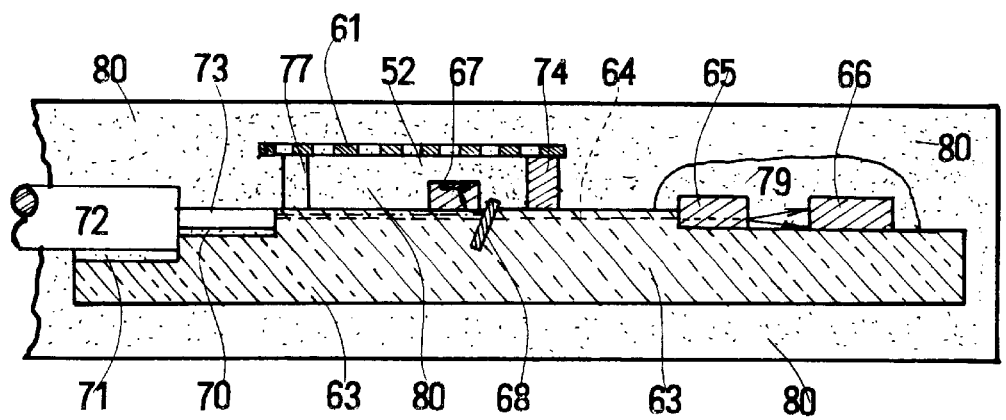
FIG. 15 is a sectional view of a part of the resin-packaged PD/LD module having the silicon platform including the straight light waveguide, the PD, the AMP, the WDM filter, the LD, the monitoring PD, the pillows and the multihole metal plate.

Embodiment 2 employs a straight waveguide, a WDM filter and an upward branch. FIG. 13 to FIG. 15 denote embodiment 2. The WDM for dividing light signals into the 1.3 μm and the 1.55 μm is realized by a dielectric multilayer filter. FIG. 13 shows a plan view of the waveguide, devices arranged upon a silicon bench 63. The silicon bench (platform) 63 is a rectangular $SiO_2$ (001) single crystal. The Si bench has two steps at the front part, a step at the rear part and a plateau in the middle.

The straight waveguide 64 is made in a longitudinal direction on the plateau. The device features the alignment of a PD 67 and an LD 65 along the straight waveguide 64. The LD 65 is mounted on the rear step facing directly the end of the waveguide 64. The height of the waveguide 64 coincides with the height of the emission stripe of the LD 65. A monitoring PD 66 is fixed on the rear step on an extension of the waveguide 64 for sensing the power of the LD 65. The forward-emitted light from the LD 65 propagates in the waveguide 64. The rear-emitted light from the LD shoots the monitoring PD 66. The PD 66 monitors the output power of the LD 65 and feeds back the power to the driving circuit for maintaining the LD power at a constant level. The transmitting part consists of the LD 65 and the monitoring PD 66.

The PD 67 for receiving signals is fitted at the middle on the waveguide 64. A slanting WDM filter 68 is inserted into a slanting groove of the bench, following the PD 67 and traversing the waveguide 64. The slanting angle of the WDM 68 is, for example, 30 degrees 20 degrees to 50 degrees are also allowable for the slanting angle. At the slanting angle, the WDM 68 has a selective function of allowing the transmitting light (1.3 μm) to pass but of reflecting the receiving light (1.55 μm) back in the upward direction. The receiving light is reflected upward by the WDM filter 68 and goes into the PD 67 through the bottom opening. If the reflected light cannot enter the PD 67 directly, the PD should be mounted upon a spacer for raising the position of the PD 67. An AMP 69 accompanies the PD 67 for amplifying the photocurrent of the PD 67. The receiving part 52 consists of the PD 67 and the AMP 69.

The front end of the Si bench 63 has two steps for supporting a fiber end. The second step nearer to the waveguide 64 has a shallower V-groove 70. The first step farther from the waveguide 64 has a deeper V-groove 71. A coating is peeled at an end of a fiber 72 for revealing the fiber (cladding + core). The diameter of the cladding is 125 μm. The coating has, e.g., a 0.9 mm diameter. The revealed fiber end 73 is inserted in the smaller V-groove 70. The coating 72 is inserted in the larger V-groove 71. The ends are fixed in the V-grooves 70 and 71 by an adhesive. The depth and the position of the V-grooves have been previously adjusted for harmonizing the center of the fiber with the waveguide 64. Self-alignment is accomplished only by fixing the ends of the fiber into the V-grooves 70 and 71.

Anisotropic etching forms the V-grooves 70 and 71 on the Si single crystal substrate 63. Since the Si bench 63 is a (001) single crystal, a special etchant which has the lowest etching rate on {111} planes can reveal only {111} planes selectively. The anisotropic etchant can make V-grooves having a (1–11) wall and a (–111) wall. The slanting angle of the walls to the surface (001) is 54.7 degrees. The walls meet with each other at 70.5 degrees on the bottom line. The Si (platform) substrate 63 has metallized patterns made by printing or photolithography. The PD 67 and the AMP 69 are bonded on a PD ground metallized pattern. The LD 65 is fixed upon an LD ground metallized pattern. The ground of the PD is separated from the ground of the LD. Two ground patterns are connected by an external circuit. The separation of the grounds aims at separating the PD from the noise of the LD. There are other wiring metallized patterns on the Si-bench 63 besides the grounds patterns. The metallized patterns are omitted in FIG. 13.

The PD ground pattern has pillows 74, 75, 76, 77 and 78 made from metal, e.g., stainless steel or Kovar. The pillows are all grounded. In the example, the pillow 74 is a stainless steel column of 0.5 mm(W)×4.5 mm(L)×1 mm(H). The pillows 75 to 78 are stainless steel column of 0.5 mm(W)× 0.5 mm(L)×1 mm(H). The height of 1 mm is determined by considering the heights (0.2 mm to 0.3 mm) of the PD chip and the LD chip. As shown in FIG. 15, the multihole plate 61 is glued upon the pillows 74 to 78 for shielding the PD part from the noise yielded by the LD part in accordance with the teaching of the present invention.

In the example, the multihole plate 61 is also made of stainless steel. The thickness is 0.1 mm. The width and the length are equally 4.5 mm. The holes are formed by etching. The holes can be also mechanically perforated by a pressing machine. Smaller size of the holes is preferable, as long as the fluid resin can infiltrate through. For example, the diameter of the hole is 0.3 mm. FIG. 14 shows the state of covering all the receiving part with the multihole metal plate 61.

The LD 65 and the monitoring PD 66 are buried in with a transparent resin 79 which allows the backward light from the LD 65 to lead to the PD 66. Whole of the bench and the devices are enclosed and molded with an opaque resin 80. The opaque resin 80 constitutes an inexpensive plastic package. FIG. 15 denotes the packaged state. In the figure, the fluid resin flows through the many holes 62 of the multihole metal plate 61 into the inner receiving part 52. The resin can invade into the receiving part also through the gaps of pillows. The resin fills the external space and the inner space with the same density. The reason why the shielding metal should be either a mesh or a multihole plate is that the holes allow the injected fluid resin to infiltrate into the shielded receiving part.

Figure 20:
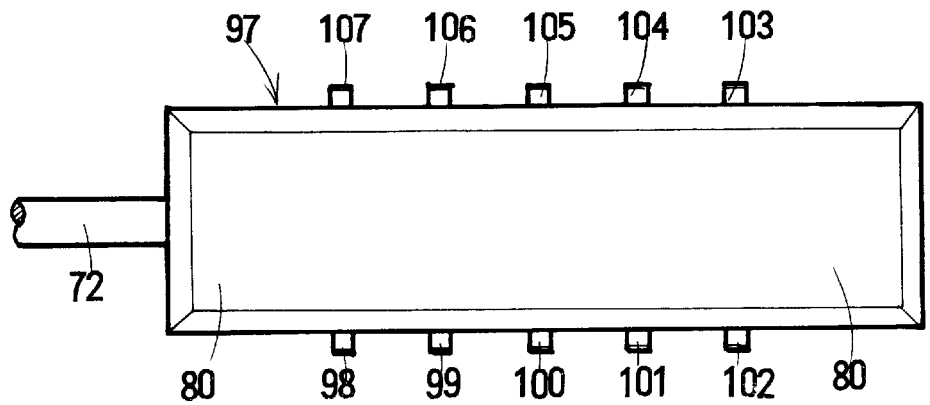
FIG. 20 is a plan view of the resin-packaged LD/PD module shown in FIG. 15, FIG. 17 and FIG. 19.

The transparent resin 79 is, for example, a silicone type resin which keeps intrinsic elasticity after hardening. The molding resin 80 for fixation is, for example, an epoxy type resin which is excellent in adherence. The use of two kinds of resins conciliates the different requirements of hardness and transparency. The present invention employs a cheap plastic mold package in stead of a costly ceramic package or metal package for the sake of alleviating the cost. The complete device is shown in FIG. 20 (plan view), FIG. 21 (front view) and FIG. 22 (side view). The package is an ordinary dual-in-line type (DIP) package having pins 98, 99, 100, 101, 102, 103, 104, 105, 106 and 107 on both sides. The device is one of commonplace, popular types in form except dragging the fiber 72.

The above explanation has clarified the structural feature of the embodiment of FIG. 13. The manufacturing process is explained. A (001) silicon bench of a measure of 15 mm×5 mm is prepared. Two steps and one step are shaped on the left side and on the right side by etching or grinding. V-grooves 70 and 71 are dug by the anisotropic etching on the two steps of the left side. An optical waveguide 64 is produced on the middle plateau along the central axial line by the steps of depositing a silicon dioxide ($SiO_2$) transparent layer on the silicon bench, doping the central line with a dopant which raises the refractive index of $SiO_2$. A slanting groove is dug vertically to the waveguide on the plateau. A WDM filter 68 is inserted into the slanting groove. A PD 67 for receiving signals is soldered via a spacer to the bench at a spot just before the WDM filter 68 above the central waveguide. The WDM 68 prepares an upward-branch by reflecting only the receiving light upward to the PD 67. The WDM 68 allows the LD light to pass through without loss. The narrow space near the spacer is filled with a transparent resin for allowing the light to pass through. The receiving PD (D-PD) is, for example, an InGaAs type photodiode. An AMP chip 69 is mounted on the bench in the vicinity of the PD 67.

An LD chip 65 is soldered on a metallized ground pattern of the right step just beyond the end of the waveguide 64. This is, for example, an InGaAsP-LD chip. A monitoring InGaAs-PD 66 follows the LD 65 along the extension of the central line for detecting the power of the LD 65. A transparent resin 79 is supplied to the space including the LD 65 and the PD 66 for ensuring a transparent path.

The metallized patterns are joined to the corresponding electrode pads of the PD 67, the PD 66, the AMP 69 and the LD 65 by wirebonding. Pillows 74 to 78 are stuck to the PD ground pattern. A multihole metal plate 61 is fixed on the pillows 74 to 78. The multihole plate 61 and the pillows are grounded. The metal plate, the ground pattern and the pillows shield and protect the PD 67 and the AMP.

The silicon bench is mounted on a lead frame (omitted in FIG. 13 to FIG. 15). Lead pins are connected by wires to the corresponding metallized patterns.

A revealed fiber end 73 is inserted into the smaller V-groove 70 and a cable coating 72 is inserted into the bigger V-groove 71. The revealed fiber end 73 and the coating 72 are glued by the epoxy adhesive. Self-alignment of the V-grooves dispenses with the alignment process which would waste much time.

Figure 21:
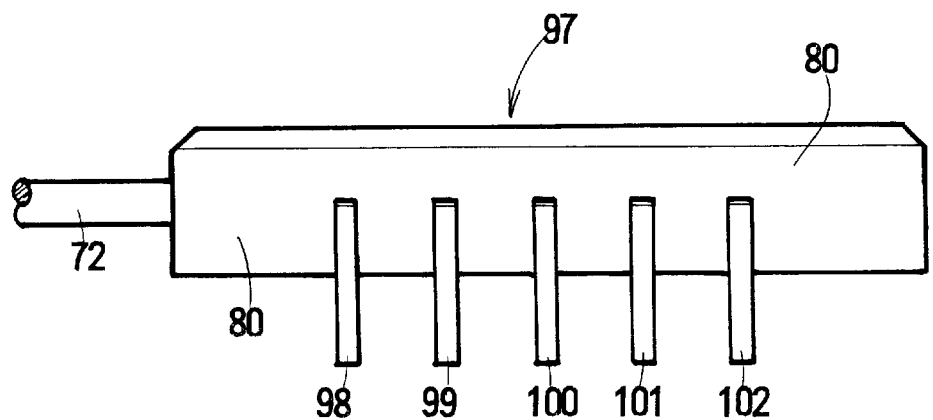
FIG. 21 is a front view of the resin-packed LD/PD module shown in FIG. 15, FIG. 17 and FIG. 19.
Figure 22:
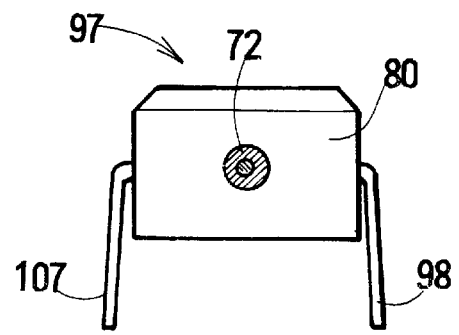
FIG. 22 is a left side view of the resin-packed LD/PD module shown in FIG. 15, FIG. 17 and FIG. 19.

Finally, the module of FIG. 20 to FIG. 22 is completed by molding the whole of the Si-bench and the lead frame by some mold material, e.g., an epoxy resin.

Lead pins 98 to 107 are provided to join the PD, the LD and the AMP to an external circuit. The number of lead pins is contingent upon the inner circuit. For example, the least number of lead pins is determined by the following consideration. One pin should be allotted to the LD/(monitoring) PD ground. Another pin should be allocated to the driving pad of the LD. The monitoring PD requires another pin. A further pin should be the ground of the PD/AMP. Another pin should be used for the bias of the signal PD. The AMP requires two pins. At least seven pins are requisite. If two or three pins were allotted to the same ground, or the AMP takes two power sources, the device would require more than seven pins. This example has ten pins.

The example gives about a 5 mm distance between the sensing PD 67 and the transmitting LD 65. Although the two chips are adjacent enough, the metal plate 61, the pillows and the ground pattern shields the PD from the noise of the LD. The receiving PD enjoys a high sensitivity of −35 dBm for the output of 0 dBm (=1 mW) of the LD at the transmission speed of 155 Mbps. This result signifies that the receiving part (PD) is safely protected from the noise from the transmitting part (LD).

The above example has only a couple of PD and LD. The embodiment can easily be applied to a multi-fiber type module having a plurality of pairs of PD and LD and a plurality of fibers.

[Embodiment 3 (Straight Waveguide, Upward Branch, Multihole Cap)]

Figure 16:
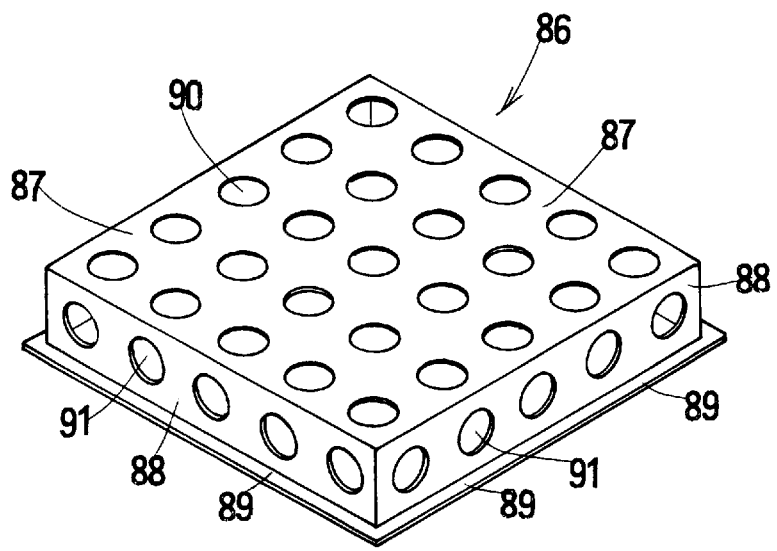
FIG. 16 is a perspective view of a cap-shaped multihole metal plate for covering the receiving part including the PD and the AMP.
Figure 17:
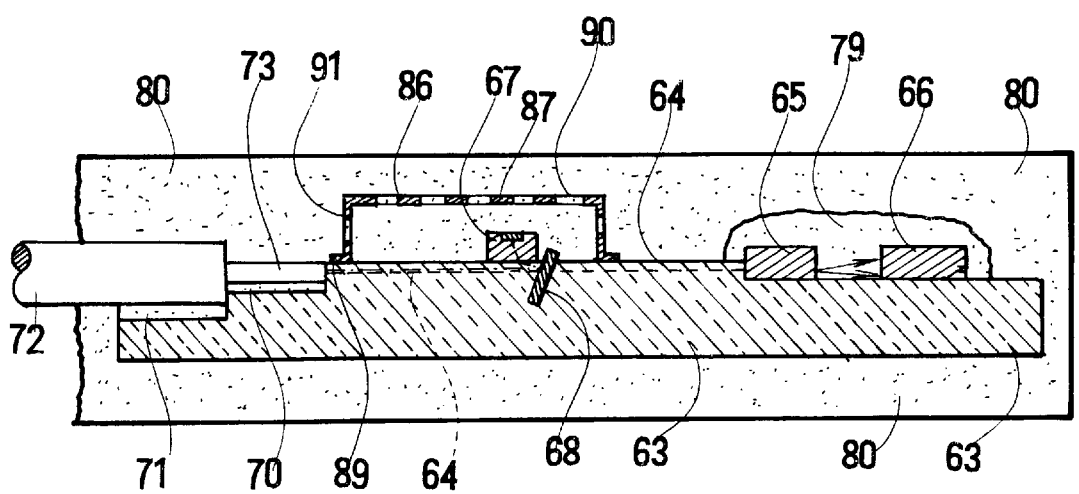
FIG. 17 is a sectional view of a part of the resin-packaged PD/LD module having the silicon platform including the straight light waveguide, the PD, the AMP, the WDM filter, the LD, the monitoring PD, the pillows and the cap-shaped metal plate covering the receiving part including the PD and the AMP.

Embodiment 3 which is shown in FIG. 16 and FIG. 17 employs a straight waveguide, a WDM filter and a multihole metal cap. Although this example is similar to Embodiment 2, the shield structure is further sophisticated. Embodiment 3 dispenses with pillows. Instead of pillows and metal plate, the shield member is a simple multihole metal cap 86 shown in FIG. 16. The cap 86 is prepared by bending four sides of a punched multihole metal plate at right angles. The metal cap 86 of FIG. 16 is more convenient than the metal plate 61 of FIG. 12 for mounting on the bench. The metal cap 86 contains a top plate 87, side plates 88 and a fringe 89. The top plate 87 is perforated with a plurality of holes 90. The side plates 88 have a plurality of holes 91. The multihole metal cap 86 is, for example, a stainless steel plate (e.g., 0.1 mm thick) formed into a cap-shape of 4.5 mm(L)×4.5 mm(W)×1 mm(H). The holes 90 and 91 allow the fluid resin to go through.

FIG. 17 is a vertically sectional view of embodiment 3. This embodiment lacks the pillows unlike embodiment 2 of FIG. 15. The fringe 89 of the multihole metal cap 86 is directly soldered to the PD/AMP ground pattern. Other structures are similar to the former example of FIG. 15. A silicon bench 63 has steps on the right side and the left side. The middle plateau has a longitudinal, central straight waveguide 64. An LD 65 and a monitoring PD 66 stand on the rear step as the transmitting part. A PD 67 and a WDM 68 are provided on the middle plateau in the midway of the waveguide 64. An end of a fiber 72 is aligned in V-grooves 71 and 70 at the front end of the waveguide 64 for exchanging signal light between the fiber 72 and the waveguide 64. The metallized patterns are joined to lead frames by wires. The whole of the bench and the lead frame are molded in a resin package 80.

The transmitting light and the receiving light propagate in the waveguide 64 in reverse directions. The down-flow receiving light from the fiber goes rightward in the waveguide 64, is reflected by the WDM 68 and is guided into the PD 67 via a bottom surface. The receiving light generates photocurrent in the PD 67. The up-flow transmitting light from the LD 65 goes leftward in the waveguide 64, passes the WDM 68 with little loss and goes into the fiber 72.

[Embodiment 4 (Straight Waveguide, Upward Branch, Metal Mesh Cap, Shielded LD)]

Figure 18:
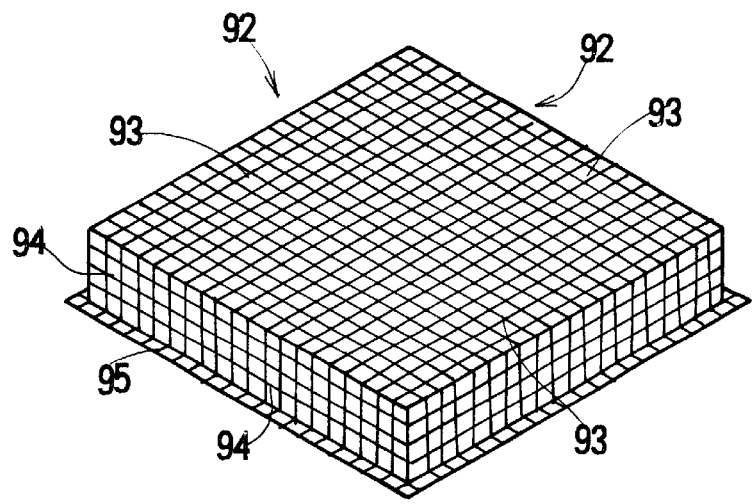
FIG. 18 is a perspective view of a cap-shaped metal mesh for covering the receiving part including the PD and the AMP.
Figure 19:
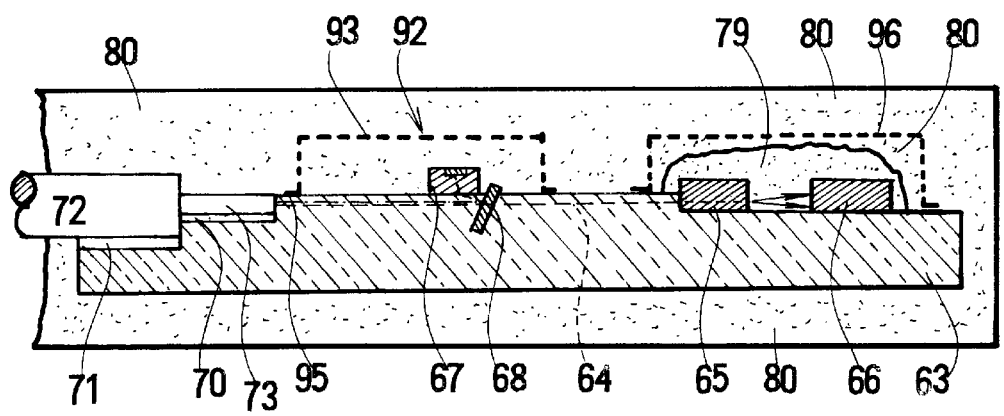
FIG. 19 is a sectional view of a part of the resin-packaged PD/LD module having the silicon platform including the straight light waveguide, the PD, the AMP, the WDM filter, the LD, the monitoring PD, the pillows and the cap-shaped metal meshes covering both the receiving part and the transmitting part.

FIG. 18 and FIG. 19 show embodiment 4 having a straight waveguide, a WDM filter and a metal mesh cap. Resembling embodiments 2 and 3, this example employs a metal mesh cap 92 and encloses also the transmitting part with the metal mesh cap. The double shields protect the PD part more completely from the LD part.

Dispense with pillows, embodiment 4 exploits metal mesh caps made by folding sides of a mesh as shown in FIG. 18. The mesh cap 92 is more advanced than the mesh 53 of FIG. 8. The mesh cap 92 contains a top mesh 93, side meshes 94 and a fringe 95. Many small holes densely populate the top and the sides. The many holes facilitate the fluid resin to penetrate into the receiving part and the transmitting part.

FIG. 19 is a vertically sectioned view of embodiment 4. The structure resembles to the examples of FIG. 15 and FIG. 17. A first metal mesh cap 92 is soldered on the receiving part containing a PD and an AMP. A second mesh metal cap 96 is fixed on the transmitting part including an LD 65, a monitoring PD 66 and a hardened resin 79. A DIP (dual-in-line) type plastic packaged LD/PD module 97 of FIG. 20 to FIG. 22 is obtained by putting a silicon bench 63 and a lead frame in a mold and supplying the mold with a plastic material, e.g., epoxy resin and hardening the resin by heating or cooling.

[Embodiment 5 (Y-branch Waveguide Type; Γ-shaped Metal Shield)]

Figure 23:
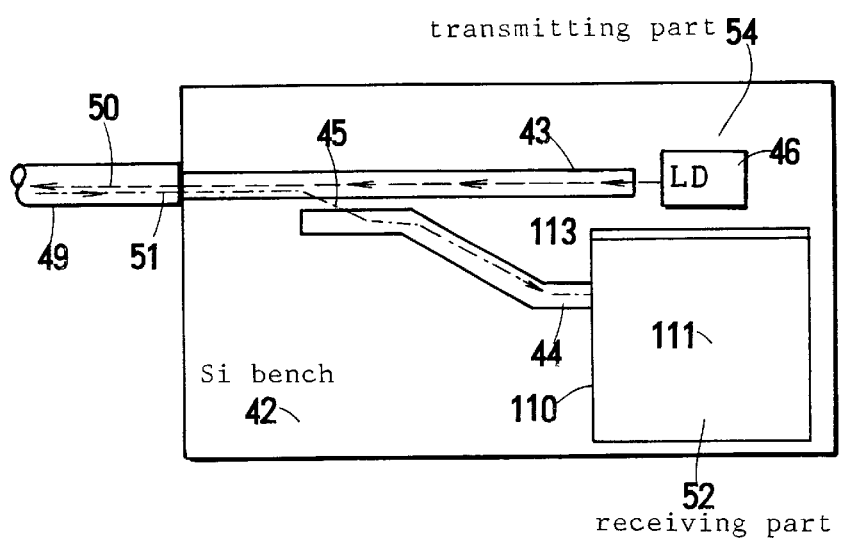
FIG. 23 is a plan view of an LD/PD module unifying a receiving part and a transmitting part branched on a single Si bench and covering the receiving part with a holeless Γ-shaped metal plate as embodiment 5.
Figure 24:
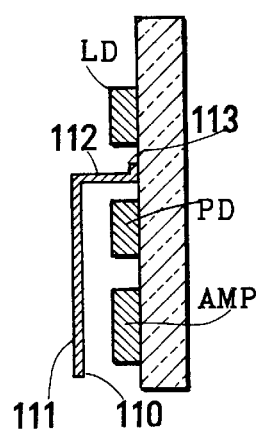
FIG. 24 is a vertically sectional view of the LD/PD module of FIG. 23.

FIG. 23 and FIG. 24 demonstrate embodiment 5 having a silicon bench (platform) 42 having a transmitting part (LD) 46 and a receiving part (PD and AMP) 52 coupled by a Y-branch waveguide. The fundamental structure resembles embodiment 1. Instead of the mesh, a Γ-shaped metal plate 110 protects and covers a PD and an AMP of the receiving part 52. The Γ-shaped metal plate 110 has a wide top 111, a short vertical wall 112 and a adhering edge 113. The metal plate 110 is soldered at the edge 113 on a metallized ground pattern on the bench 42. The Γ-shaped plate 110 protects the PD and the AMP from noise. The metal plate 110 has no hole. But three open sides admit the resin to cover and fill the receiving part 52.

[Embodiment 6 (Y-branch Waveguide Type; T-shaped Metal Shield)]

Figure 25:
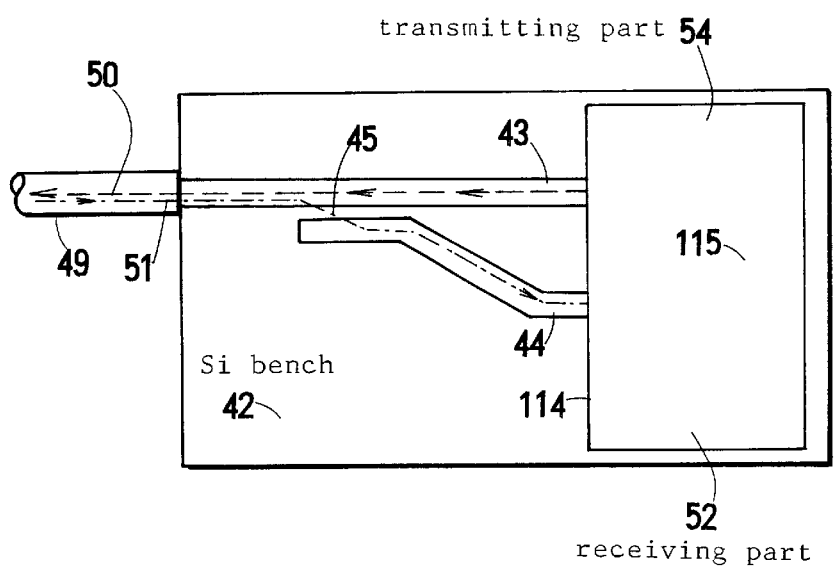
FIG. 25 is a plan view of an LD/PD module unifying a receiving part and a transmitting part branched on a single Si bench and covering both the receiving part and the transmitting part with a holeless T-shaped metal plate as embodiment 6.
Figure 26:
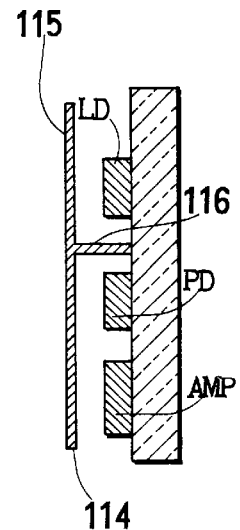
FIG. 26 is a vertically sectional view of the LD/PD module of FIG. 25.

FIG. 25 and FIG. 26 demonstrate embodiment 6 having a silicon bench (platform) 42 having a transmitting part (LD) 46 and a receiving part (PD and AMP) 52 coupled by a Y-branch waveguide. The fundamental structure resembles embodiment 1. Instead of the mesh, a T-shaped metal plate 114 protects and covers a PD and an AMP of the receiving part 52 and an LD of the transmitting part 54. The T-shaped metal plate 114 has a wide top 115 and a short vertical wall 116. The metal plate 114 is soldered at the foot of the vertical wall 116 on a metallized ground pattern on the bench 42. The T-shaped plate 114 protects the PD and the AMP from noise. The metal plate 114 has no hole. But six open sides admit the resin to cover and fill the receiving part 52 and the transmitting part 54.

[Embodiment 7 (Straight Waveguide Type, Upward Branch; Γ-shaped Metal Shield)]

Figure 27:
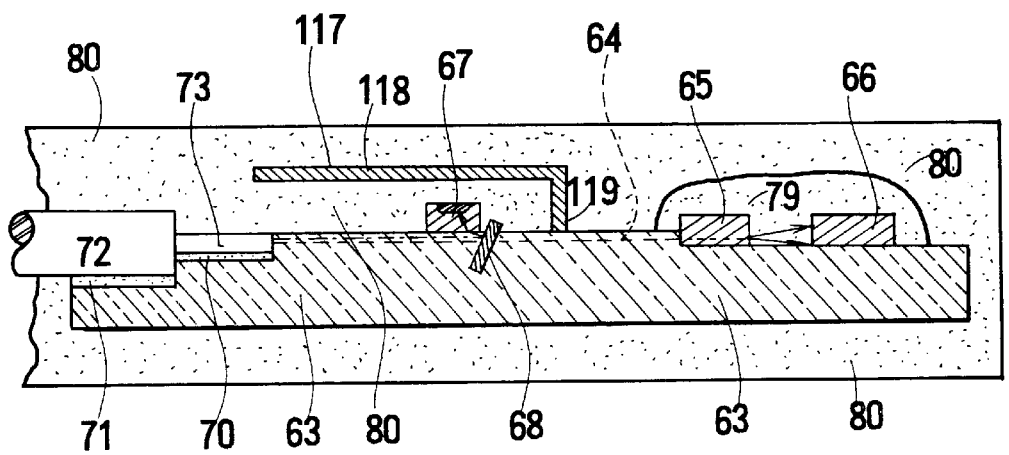
FIG. 27 is a vertically sectional view of an LD/PD module unifying a receiving part and a transmitting part directly aligning on a single Si bench and covering the receiving part with a holeless Γ-shaped metal plate as embodiment 7.
Figure 28:
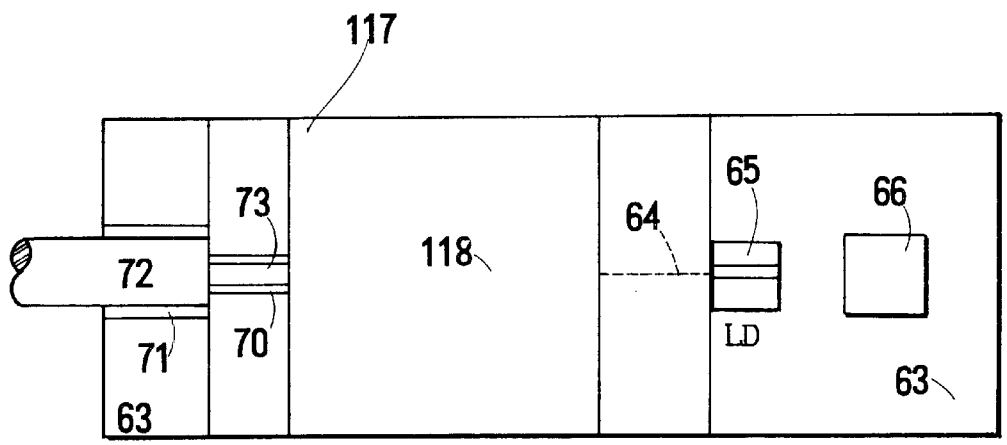
FIG. 28 is a plan view of the LD/PD module of FIG. 27.

FIG. 27 and FIG. 28 demonstrate embodiment 7 having a silicon bench (platform) 63 having a transmitting part (LD) and a receiving part (PD and AMP) coupled by a straight line waveguide. The fundamental structure resembles embodiment 2. Instead of the mesh or the multihole plate, a Γ-shaped metal plate 117 protects and covers a PD 67 and an AMP of the receiving part. The Γ-shaped metal plate 117 has a wide top 118 and a short vertical wall 119. The Γ-shaped metal plate 117 is soldered at the foot of the vertical wall 119 on a metallized ground pattern on the bench 63. The cantilevered Γ-shaped plate 117 protects the PD and the AMP from noise. The metal plate 117 has no hole. But three open sides admit the resin to cover and fill the receiving part.

[Embodiment 8 (Straight Waveguide Type, Upward Branch; T-shaped Metal Shield)]

Figure 29:
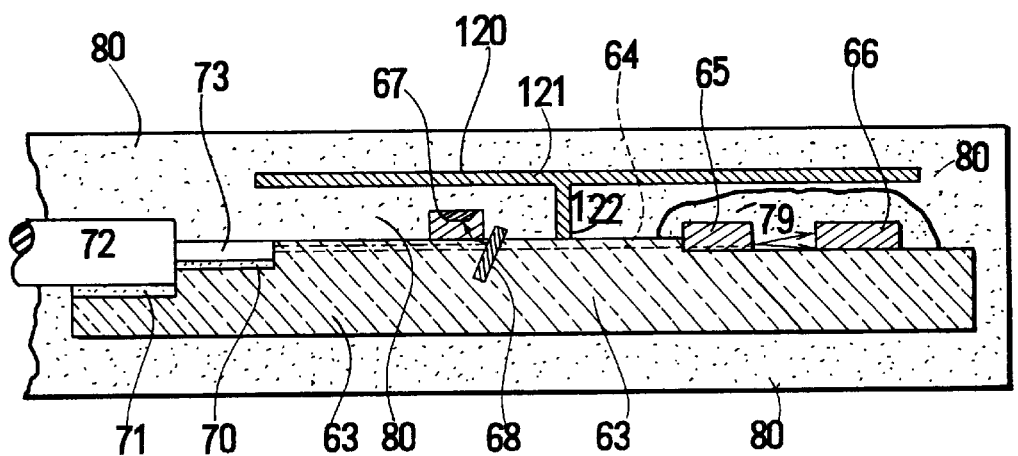
FIG. 29 is a vertically sectional view of an LD/PD module unifying a receiving part and a transmitting part directly aligning on a single Si bench and covering both the receiving part and the transmitting part with a holeless T-shaped metal plate as embodiment 8.
Figure 30:
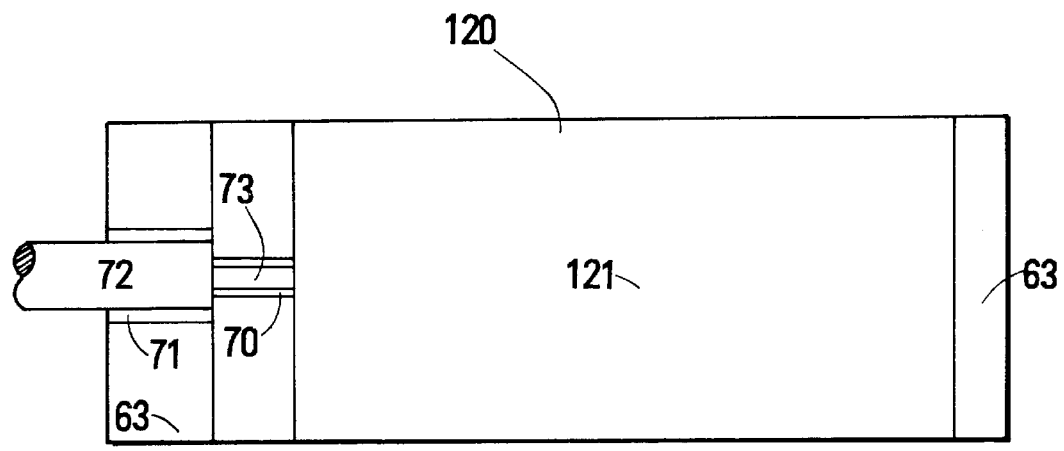
FIG. 30 is a plan view of the LD/PD module of FIG. 29.

FIG. 29 and FIG. 30 demonstrate embodiment 8 having a silicon bench platform) 63 having a transmitting part (LD) and a receiving part (PD and AMP) coupled by a straight line waveguide. The fundamental structure resembles embodiment 2. Instead of the mesh or the multihole plate, a T-shaped metal plate 120 protects and covers a PD 67 and an AMP of the receiving part and an LD 65 on the transmitting part. The T-shaped metal plate 120 has a wide top 121 and a short vertical wall 122. The metal plate 120 is soldered at the foot of the vertical wall 122 on a metallized ground pattern on the bench 63. The T-shaped plate 120 protects the PD and the AMP from noise. The metal plate has no hole. But six open sides admit the resin to cover and fill the receiving part and the transmitting part.

[Embodiment 9 (Straight Waveguide Type, Upward Branch; Two Γ-shaped Metal Shields)]

Figure 31:
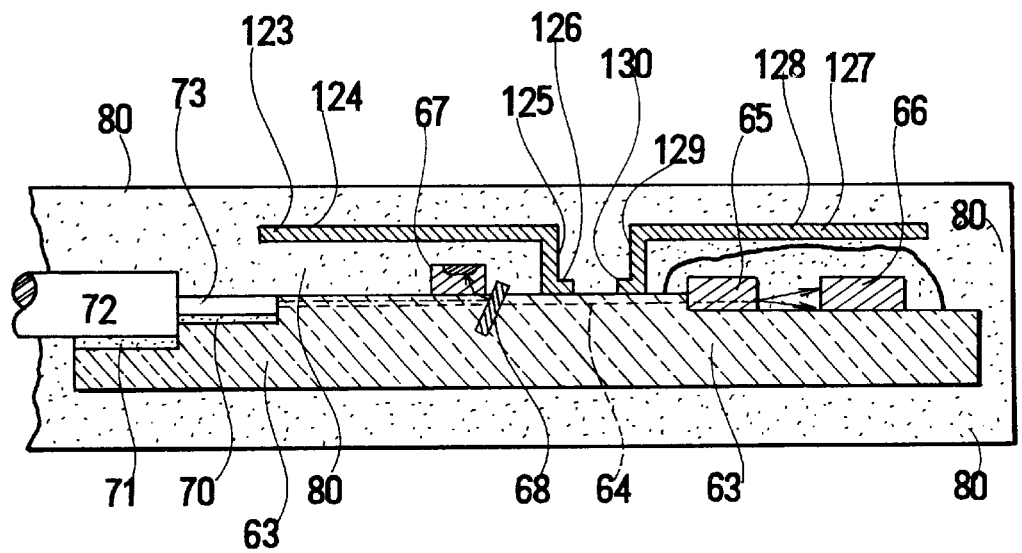
FIG. 31 is a vertically sectional view of an LD/PD module unifying a receiving part and a transmitting part directly aligning on a single Si bench and covering both the receiving part and the transmitting part with separated holeless Γ-shaped metal plates as embodiment 9.
Figure 32:
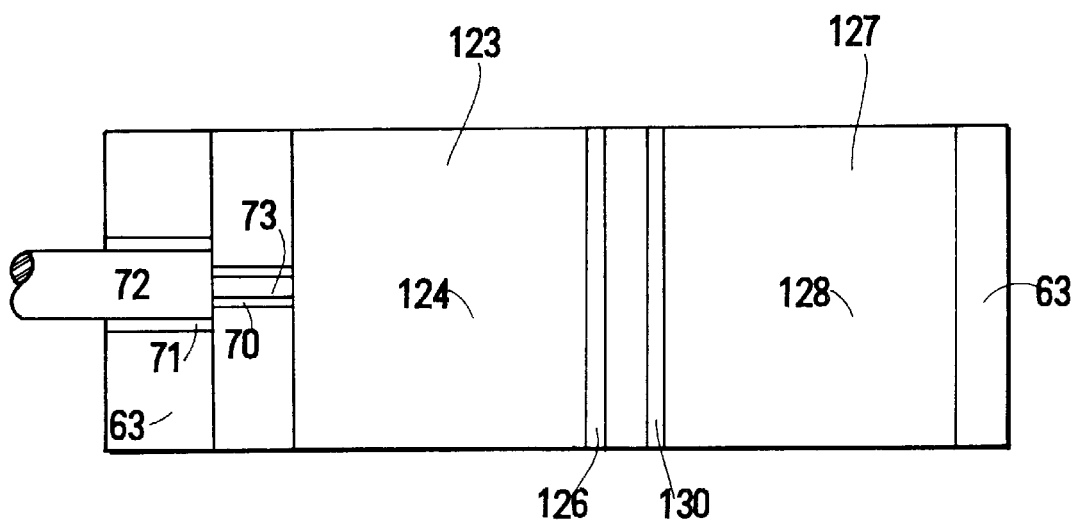
FIG. 32 is a plan view of the LD/PD module of FIG. 31.

FIG. 31 and FIG. 32 demonstrate embodiment 9 having a silicon bench (platform) 63 having a transmitting part (LD) and a receiving part (PD and AMP) coupled by a straight line waveguide. The fundamental structure resembles embodiment 2. Instead of the mesh or the multihole plate, a Γ-shaped metal plate 123 protects and covers a PD 67 and an AMP of the receiving part. Another Γ-shaped metal plate 127 covers an LD 65 of the transmitting part. The T-shaped metal plate 123 has a wide top 124 and a short vertical wall 125 and an adhering edge 126. The Γ-shaped metal plate 127 has a wide top 128 and a short vertical wall 129 and an adhering edge 130. The metal plates 123 and 127 are soldered at the edges 126 and 130 on a metallized ground pattern on the bench 63. The T-shaped plate 123 protects the PD and the AMP from noise. Both the metal plates 123 and 127 have no hole. But six open sides admit the resin to cover and fill the receiving part and the transmitting part.

What we claim is:

1. A light transmitting/receiving module comprising:

a substrate;

patterns metallized on the substrate;

a transmitting part including a light source and being made on the substrate;

a receiving part including a photodetector and a ground and being made on the substrate;

a light propagating medium provided on the substrate;

at least one light waveguide for allowing transmitting light and receiving light to propagate and for coupling the light propagating medium to the transmitting part and the receiving part;

a filter mounted on the waveguide or an optical coupler constructed in the waveguide for separating the receiving light from the transmitting light; and a metal shielding member having holes or opening sides for covering at least a part of the receiving part and being connected to the ground of the receiving part.

2. A light transmitting/receiving module as claimed in claim 1, further comprising:

a lead frame with pins connected to the metallized patterns; and a plastic mold package covering and unifying the substrate, the transmitting part, the receiving part and the lead frame with a resin, the resin infiltrating into and filling the receiving part.

3. A light transmitting/receiving module as claimed in claim 1, wherein the receiving part includes a photodiode (PD) as a photodetector and an amplifier (AMP) and the transmitting part includes a laser diode (LD) as a light source.

4. A light transmitting/receiving module as claimed in claim 1, wherein the receiving part includes an avalanche photodiode (APD) as a photodetector.

5. A light transmitting/receiving module as claimed in claim 1, wherein the light source is a light emitting diode (LED).

6. A light transmitting/receiving module as claimed in claim 3, wherein the transmitting part and the receiving part use different wavelengths of light and the filter is a WDM filter which separates the receiving light from the transmitting light by the difference of the wavelengths.

7. A light transmitting/receiving module as claimed in claim 6, wherein the light propagating medium is an optical fiber.

8. A light transmitting/receiving module as claimed in claim 6, wherein the light propagating medium is a waveguide.

9. A light transmitting/receiving module as claimed in claim 6, wherein the transmitting light is 1.3 $\mu$m in wavelength and the receiving light is 1.55 $\mu$m in wavelength.

10. A light transmitting/receiving module as claimed in claim 6, wherein the transmitting light is 1.55 μm in wavelength and the receiving light is 1.3 μm in wavelength.

11. A light transmitting/receiving module as claimed in claim 6, wherein the substrate is a silicon crystal plate.

12. A light transmitting/receiving module as claimed in claim 6, wherein the substrate is a ceramic plate.

13. A light transmitting/receiving module as claimed in claim 1, wherein the metal shielding member is a metal mesh plate and the metal mesh is supported by pillows connected to the ground of the receiving part.

14. A light transmitting/receiving module as claimed in claim 1, wherein the metal shielding member is a multihole metal plate and the multihole metal plate is supported by pillows connected to the ground of the receiving part.

15. A light transmitting/receiving module as claimed in claim 1, wherein the metal shielding member is a multihole metal cap and the multihole metal cap is directly fixed on the ground of the receiving part.

16. A light transmitting/receiving module as claimed in claim 1, wherein the metal shielding member is a metal mesh cap and the metal mesh cap is directly fixed on the ground of the receiving part.

17. A light transmitting/receiving module as claimed in claim 1, wherein the transmitting part has a ground and the transmitting part is also enclosed with a metal shielding member having holes or opening sides and the metal shielding member is connected to the ground of the transmitting part.

18. A light transmitting/receiving module as claimed in claim 16, wherein the transmitting part has a ground, the transmitting part is also enclosed with a metal mesh cap and the metal mesh cap is connected to the ground of the transmitting part.

19. A light transmitting/receiving module as claimed in claim 15, wherein the transmitting part has a ground, the transmitting part is also enclosed with a multihole metal cap and the multihole metal cap is connected to the ground of the transmitting part.

20. A light transmitting/receiving module as claimed in claim 14, wherein the transmitting part has a ground, the transmitting part is also enclosed with a multihole metal plate and metal pillows and the pillows are connected to the ground of the transmitting part.

21. A light transmitting/receiving module as claimed in claim 13, wherein the transmitting part has a ground, the transmitting part is also enclosed with a metal mesh plate and metal pillows and the pillows are connected to the ground of the transmitting part.

22. A light transmitting/receiving module as claimed in claim 6, wherein the photodetector is an InGaAs-PD.

23. A light transmitting/receiving module as claimed in claim 6, wherein the light source is an InGaAsP-LD.

24. A light transmitting/receiving module as claimed in claim 6, wherein the AMP is a Si-AMP IC.

25. A light transmitting/receiving module as claimed in claim 6, wherein the AMP is a GaAs-AMP IC.

26. A light transmitting/receiving module as claimed in claim 1, wherein the metal shielding member is a Γ-shaped holeless metal plate and the Γ-shaped holeless metal plate is bonded to the ground of the receiving part for covering the receiving part.

27. A light transmitting/receiving module as claimed in claim 26, wherein the bench has a Y-branch having a WDM and two ends, one end leads to the LD, the other end leads to the PD and the Γ-shaped holeless metal plate covers the receiving part.

28. A light transmitting/receiving module as claimed in claim 26, wherein the bench has a straight line waveguide leading to the transmitting part, the straight line waveguide has a WDM allowing the transmitting light to pass and reflecting the receiving light upward to the PD and the Γ-shaped holeless metal plate covers the receiving part.

29. A light transmitting/receiving module as claimed in claim 28, wherein another Γ-shaped holeless metal plate is bonded to the ground of the transmitting part for covering the transmitting part.

30. A light transmitting/receiving module as claimed in claim 1, wherein the metal shielding member is a T-shaped holeless metal plate and the T-shaped holeless metal plate is bonded to the ground of the receiving part for covering both the receiving part and the transmitting part.

31. A light transmitting/receiving module as claimed in claim 30, wherein the bench has a Y-branch having a WDM and two ends, one end leads to the LD, the other end leads to the PD and the T-shaped holeless metal plate covers both the receiving part and the transmitting part.

32. A light transmitting/receiving module as claimed in claim 30, wherein the bench has a straight line waveguide leading to the transmitting part, the straight line waveguide has a WDM allowing the transmitting light to pass and reflecting the receiving light upward to the PD and the T-shaped holeless metal plate covers both the receiving part and the transmitting part.

* * * * *